United States Patent
Takashima

(10) Patent No.: US 6,333,668 B1
(45) Date of Patent: *Dec. 25, 2001

(54) SEMICONDUCTOR DEVICE FOR SUPPRESSING CURRENT PEAK FLOWING TO/FROM AN EXTERNAL POWER SUPPLY

(75) Inventor: Daisaburo Takashima, Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/705,264

(22) Filed: Aug. 29, 1996

(30) Foreign Application Priority Data

Aug. 30, 1995 (JP) .................................... 7-221826

(51) Int. Cl.[7] .................................................. G05F 1/00
(52) U.S. Cl. .................... 327/538; 327/530; 327/535; 365/189.07; 365/189.09; 323/223
(58) Field of Search .................... 327/535, 333, 327/540, 546, 541, 543, 538, 530; 365/187.07, 187.09; 323/312, 315, 223

(56) References Cited

U.S. PATENT DOCUMENTS

| | | | |
|---|---|---|---|
| 4,825,099 | 4/1989 | Barton | 307/270 |
| 4,906,867 | 3/1990 | Petty | 307/443 |
| 5,039,874 | 8/1991 | Anderson | 307/270 |
| 5,394,077 * | 2/1995 | Atsumi | 323/223 |
| 5,436,578 | 7/1995 | Brown et al. | 326/87 |
| 5,451,861 | 9/1995 | Giebel | 323/315 |
| 5,485,117 * | 1/1996 | Furumochi | 327/538 |
| 5,504,452 * | 4/1996 | Takenada | 327/541 |
| 5,547,887 | 8/1996 | Brown et al. | 437/51 |
| 5,598,119 | 1/1997 | Thayer et al. | 327/111 |
| 5,687,123 * | 11/1997 | Hidaka et al. | 365/189.09 |
| 5,689,460 * | 11/1997 | Ooishi | 327/530 |
| 5,771,389 | 6/1998 | Swartz | 395/750.01 |
| 5,834,955 | 11/1998 | Eichfeld et al. | 327/108 |

FOREIGN PATENT DOCUMENTS

| | | |
|---|---|---|
| 1-196612 | 8/1989 | (JP) . |
| 5-28759 | 2/1993 | (JP) . |
| 6-124590 | 5/1994 | (JP) . |

OTHER PUBLICATIONS

"Application Specific CMOS Output Driver Circuit Design Techniques to Reduce Simultaneous Switching Noise", R. Senthinathan and J.L. Prince, IEEE Journal of Solid–State Circuits, vol. 28, No. 12, Dec. 1993, pp. 1383–1388.

"Design and Characterization of a CMOS Off–Chip Driver/Receiver with Reduced Power–Supply Disturbance", Hussein I. Hanafi et al., IEEE Journal of Solid–State Circuits, vol. 27, No. 5, May 1992, pp. 783–791.

"High–Speed, Low–Switching Noise CMOS Memory Data Output Buffer", Ernestina Chioffi et al., IEEE Journal of Solid–State Circuits, vol. 29, No. 11, Nov. 1994, pp. 1359–1365.

* cited by examiner

Primary Examiner—Dinh T. Le
Assistant Examiner—Dinh Le
(74) Attorney, Agent, or Firm—Oblon, Spivak, McClelland, Maier & Neustadt, P.C.

(57) ABSTRACT

A semiconductor device comprises a voltage-down circuit for generating an internal power supply voltage obtained by lowering an external power supply voltage in a chip; and a chip internal circuit applied with the internal power supply voltage obtained in the voltage-down circuit, wherein the voltage-down circuit includes a first circuit connected at one end to an external power supply, a second circuit connected between the other end of the first circuit and the internal circuit, for creating the internal power supply voltage, and a capacitor connected to a connection node of the first circuit and the second circuit and to a ground node of the chip internal circuit, and the capacitor is charged by the first circuit when a current flowing in the second circuit is smaller than a preset value and supplies a discharge current to the second circuit when the current flowing in the second circuit is larger than the preset value.

30 Claims, 12 Drawing Sheets

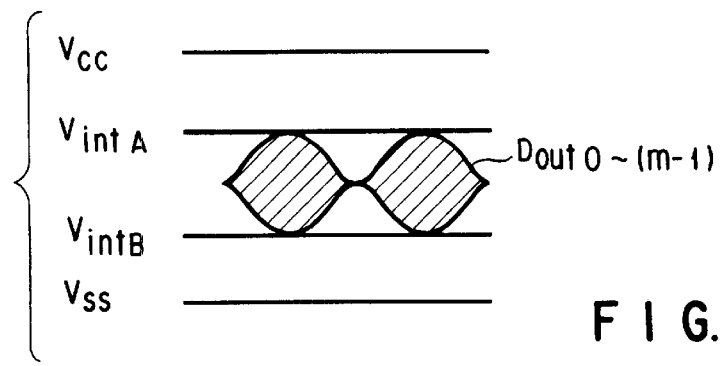
F I G. 12
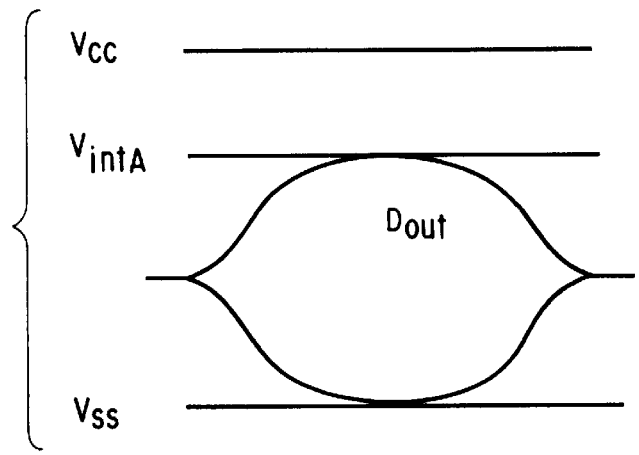
F I G. 14
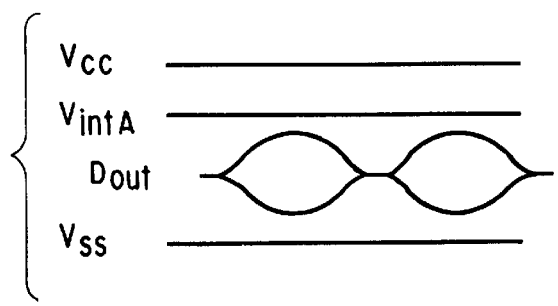
F I G. 16A
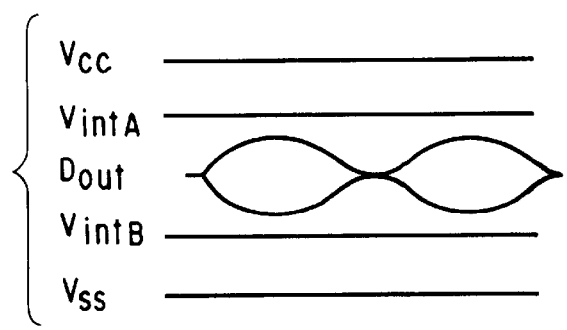
F I G. 16B // SEMICONDUCTOR DEVICE FOR SUPPRESSING CURRENT PEAK FLOWING TO/FROM AN EXTERNAL POWER SUPPLY

BACKGROUND OF THE INVENTION

1. Field of the Invention

This invention relates to a semiconductor device for creating a voltage-down (and/or booster) potential by using an internal voltage-down (and/or booster) converter with respect to an external power supply and applying the potential as an internal power supply voltage to a chip internal circuit, and more particularly to a semiconductor device capable of suppressing the current peak flowing into or from the external power supply.

2. Description of the Related Art

With the development of the fine patterning technique of semiconductor, chips such as large-scale and high-speed 32 bit- or 64 bit-MPUs containing several millions of transistors and large-capacity 16 Mbit-DRAM, 64 Mbit-DRAMs or the like are mass-produced. Therefore, the number of transistors used rapidly increases and a current consumed in the chip is extremely increased even though the power supply voltage Vcc is lowered from 5 V to 3.3 V or 3 V. An increase in the current consumption causes a serious problem of generation of power supply noise.

Particularly, if chips having a large peak current are operated at the same time, the power supply is required to have a large current supplying ability and it is necessary to dispose a large number of capacitors for stabilizing the power supply voltage on a PCB (Printed Circuit Board). Therefore, a large area for formation of capacitors is required.

Recently, in order to reduce the current consumption (power consumption) and enhance the reliability of the device, various methods for creating an internal voltage-down potential ($V_{int}$) which is lower than the power supply voltage ($V_{cc}$) in the chip by use of a DRAM or CPU and applying the internal voltage-down potential to the chip internal circuit have been proposed. One example of a chip containing a conventional voltage-down circuit is shown in FIG. 1. A voltage-down circuit 2 for lowering $V_{cc}$ to $V_{int}$ by use of a transistor Q and an operational amplifier OP is connected in series with an internal circuit 1.

Generally, when the voltage-down circuit is not used, the power P is set to $P=CV^2f$ if the power supply voltage is $V_{cc}$, the chip charging/discharging capacitance is C, and the clock frequency is f. If the internal power supply voltage is set to $V_{int}$ ($<V_{cc}$) when the voltage-down circuit is used, the power is set to $P=(V_{int}/V_{cc})CV^2f$ and is reduced even if the external power supply voltage is kept at $V_{cc}$.

However, in order to keep $V_{int}$ at a constant voltage, it is necessary to supply a current having the same waveform as that of a current ($I_{ss}$) flowing in the internal circuit 1 to the voltage-down circuit 2 in the circuit of FIG. 1. That is, the current flowing in the transistor Q is set equal to $I_{ss}$. Thus, it is necessary to set the relation of $I_{cc}(t)=I_{ss}(t)$, and in this case, $V_{int}$ can be kept constant.

In the circuit of FIG. 1, $V_{int}$ and a reference voltage $V_{ref1}$ are used as the inputs to the operational amplifier and the output thereof is supplied to the gate of Q. In this case, if $V_{ref1}>V_{int}$, Q is turned "ON", and if $V_{ref1} \leq V_{int}$, Q is turned "OFF", and as a result, the internal voltage $V_{int}$ is kept at the same value as the potential of $V_{ref1}$.

In the above circuit, as shown in FIG. 2, a variation in the voltage is reduced in comparison with a case wherein the circuit is directly connected to the external power supply $V_{cc}$ when $I_{cc}=I_{ss}$, but a current supplied from the external power supply $V_{cc}$ flows so as to become equal to the current peak ($I_{cc}$) caused by the operation of the internal circuit ($I_{ss}=I_{cc}$), and as a result, $V_{cc}$, $V_{ss}$ vary and the noise influence is large. Further, when taking not only the internal portion of the chip but also the package and PCB into consideration, variations in $V_{cc}$, $V_{ss}$ become larger and cause a serious problem since inductances occur in various portions as shown in FIG. 3. For example, in FIG. 3, if the chip A has a large current peak, not only the chip A but also the chip B is influenced.

Further, the influence by the inductance is also exerted on the internal voltage-down potential $V_{int}$ of its own chip which should be kept at a constant potential. That is, a variation in consumption current causes a further variation in the power supply voltage by the parasitic inductances of inner leads and bonding wires on the PCB. A variation of higher frequency component than the response characteristic of the internal voltage-down circuit exists, thereby fluctuation in the high-frequency component of a variation in the external power supply voltage $V_{cc}$ is transmitted as fluctuation in the internal voltage-down potential, and thus the internal power supply voltage $V_{int}$ varies by the influence of the external inductance.

As described above, in the conventional chip and conventional voltage-down circuit, a large fluctuation in the power supply voltage occurs and this becomes larger as the integration density becomes higher. As a result, the power supply noise becomes larger, and in order to cope with this problem, it is necessary to use a main power supply having a larger supply ability and a larger number of stabilizing capacitors. Further, various problems such as deterioration in the operation speed and $V_{cc}$ margin occur due to the presence of noise occur. The above conventional circuit design is made for each chip so as to stabilize only the operation of the chip against the external noise and self noise.

SUMMARY OF THE INVENTION

An object of this invention is to provide a semiconductor device capable of reducing the peak of a current to be supplied to a chip, making the supply current smooth and suppressing the power supply noise on a PCB, for example.

In order to solve the above problems, the construction of this invention is made as follows.

According to the first aspect of this invention, a semiconductor device comprises a voltage-down circuit for generating an internal power supply voltage obtained by lowering an external power supply voltage in a chip; and a chip internal circuit applied with the internal power supply voltage obtained in the voltage-down circuit, wherein the voltage-down circuit includes a first circuit connected at one end to an external power supply, a second circuit connected between the other end of the first circuit and the internal circuit, for creating the internal power supply voltage, and a capacitor connected to a connection node of the first circuit and the second circuit and to a ground node of the chip internal circuit, and the capacitor is charged by the first circuit when a current flowing in the second circuit is smaller than a preset value and supplies a discharge current to the second circuit when the current flowing in the second circuit is larger than the preset value.

In the first aspect of this invention, the voltage-down circuit for lowering the external power supply voltage $V_{cc}$ to the internal voltage-down potential $V_{int}$ is constructed by the first and second circuits and the capacitor, and a "capacitor tank" formed of a capacitor is provided in the voltage-down circuit and charges of an amount corresponding to the current consumed in the internal circuit are supplied from the capacitor tank so as to prevent $V_{int}$ from being lowered (from varying) according to the consumed current. That is, the consumed current waveform ($I_{ss1}(t)$) in the internal circuit and the waveform ($I_{AC}(t)$) of the current flowing in the second circuit which connects the capacitor tank and the internal circuit become theoretically equal to each other. A current ($I_{cc}$) which is ideally constant is supplied from the external power supply $V_{cc}$ to the capacitor tank via the first circuit to compensate for a lowering in the potential of the capacitor tank. At this time, if the internal current $I_{ss}$ is large (peak or the like), the relation of $I_{cc}<I_{ss1}=I_{AC}$ is set up, and if the internal current $I_{ss}$ is small, the relation of $I_{cc}>I_{ss1}=I_{AC}$ is set up so as to intentionally cause the potential variation in the capacitor tank. As a result, even if the internal circuit of the chip has the largest current peak, the current can be made smooth (ideally constant) in the whole chip containing the voltage-down circuit and fluctuation in the power supply voltage of the PCB or the like can be suppressed. If all of the chips on the PCB have the circuits of this invention, the fluctuation in the power supply voltage can be ideally reduced to "0".

According to the second aspect of this invention, a semiconductor device comprises a booster circuit for generating an internal power supply voltage obtained by raising an external ground voltage in a chip; and a chip internal circuit applied with the internal power supply voltage obtained in the booster circuit, wherein the booster circuit includes a first circuit connected at one end to an external ground terminal, a second circuit connected between the other end of the first circuit and the internal circuit, for creating the internal power supply voltage, and a capacitor connected to a connection node of the first circuit and the second circuit and to a power supply node of the chip internal circuit, and the capacitor is charged by the first circuit when a current flowing in the second circuit is smaller than a preset value and supplies a discharge current to the second circuit when the current flowing in the second circuit is larger than the preset value.

In the second aspect of this invention, the $V_{ss}$ side potential is raised and the internal voltage is set in the range of $V_{cc}$ to $V_{ssint}$, and thus the relation between $V_{cc}$ and $V_{ss}$ is reversed and the same effect as that of the first aspect can be attained.

A third aspect of this invention is a combination of the first and second aspects, and a semiconductor device according to the third aspect comprises a voltage-down circuit for generating a first internal power supply voltage ($V_{int1}$) obtained by lowering an external power supply voltage ($V_{cc}$) in a chip; a booster circuit for generating a second internal power supply voltage ($V_{int2}$) obtained by raising an external ground voltage ($V_{ss}$) in a chip; and a chip internal circuit applied with the internal power supply voltages ($V_{int1}$, $V_{int2}$) obtained in the voltage-down circuit and the booster circuit, wherein the voltage-down circuit includes a first circuit connected at one end to an external power supply, a second circuit connected between the other end of the first circuit and the internal circuit, for creating the first internal power supply voltage ($V_{int1}$), and a first capacitor connected to a first connection node of the first circuit and the second circuit, the booster circuit includes a third circuit connected at one end to an external ground terminal, a fourth circuit connected between the other end of the third circuit and the internal circuit, for creating the internal power supply voltage ($V_{int2}$), and a second capacitor connected to a second connection node of the third circuit and the fourth circuit, and the second capacitor is connected to the first and the second connection node.

In the third aspect of this invention, the internal potentials with respect to $V_{cc}$ and $V_{ss}$ are respectively lowered and raised, and the same effect as that of the first and second aspects can be attained. If it is used in the internal circuit which is part of the chip, a corresponding effect on this part can be attained.

The following examples are given as preferable embodiments of this invention.

(1) The first (and third) circuit is a circuit for supplying a current whose variation rate with time is smaller than the variation rate of a current flowing in the internal circuit with time.

(2) The peak current flowing in the second circuit is made larger than the peak current flowing in the first circuit. The peak current flowing in the fourth circuit is made larger than the peak current flowing in the third circuit.

(3) The first circuit is a circuit for permitting flow of current whose variation rate with time is smaller than the variation rate of the current flowing in the internal circuit with time. The third circuit is a circuit for permitting flow of current whose variation rate with time is smaller than the variation rate of the current flowing in the internal circuit with time.

(4) The first (and third) circuit is a circuit for supplying a constant current. With this configuration, the first circuit includes a transistor, in which a source is connected to an external power supply and a drain is connected to a connection node of the second circuit, operated in the saturated region.

(5) The second (fourth) circuit is a circuit for supplying a current which is substantially the same as a current flowing in the internal circuit according to the latter current.

(6) The second (fourth) circuit is a circuit for detecting the internal power supply voltage and supplying a current to keep the internal power supply voltage constant.

(7) The second circuit includes a transistor having a drain connected to the other end of the first circuit and a source connected to the internal circuit, and an operational amplifier supplied with the source potential of the transistor and a reference potential for voltage-down (or booster) potential as inverted inputs and supplying an output to the gate of the transistor, and the fourth circuit includes a transistor having a drain connected to the other end of the third circuit and a source connected to the internal circuit, and an operational amplifier supplied with the source potential of the transistor and a reference potential for booster potential as inverted inputs and supplying an output to the gate of the transistor.

(8) The voltage-down circuit and/or the booster circuit have a plurality of voltage-down circuits and/or a plurality of booster circuits formed in the same chip.

As described above, according to this invention, even if the internal circuit of the chip has a large current peak, only a constant current or smooth current flows in the chip when viewing the chip from the outside, and the power supply noise of the PCB or the like can be reduced and the ability of the main power supply and the capacitance of the capacitor of the PCB can be reduced.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 12 is an operation waveform diagram of the device shown in FIG. 11;

FIG. 14 is an operation waveform diagram of the device shown in FIG. 13;

FIGS. 16A and 16B are operation waveform diagrams of the circuit shown in FIG. 15;

DETAILED DESCRIPTION OF THE PREFERRED EMBODIMENTS

There will now be described embodiments of this invention with reference to the accompanying drawings.

(Embodiment 1)

Figure 1:
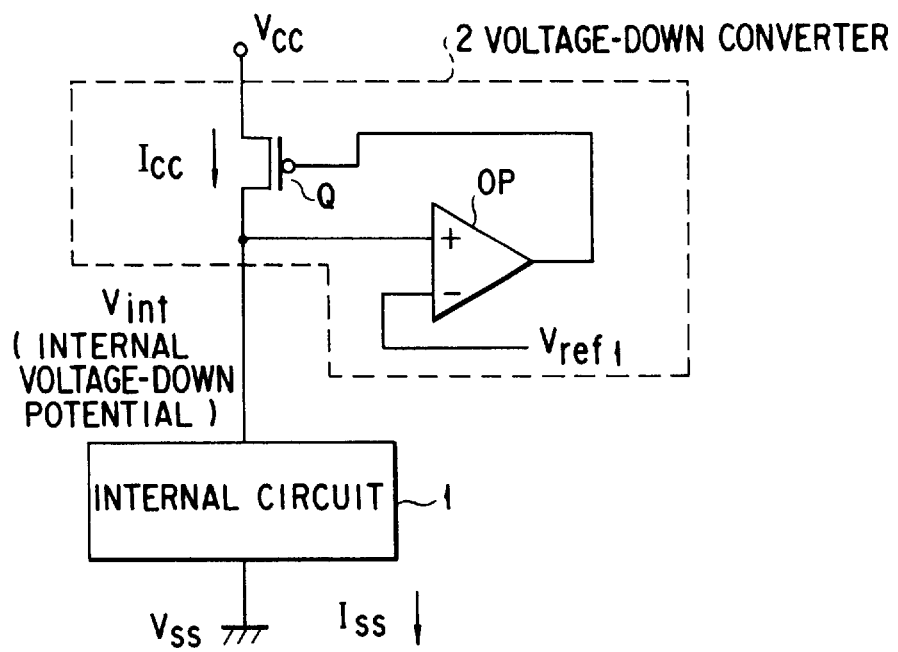
FIG. 1 is a circuit construction diagram showing an example of a chip having a conventional voltage-down circuit contained therein.
Figure 2:
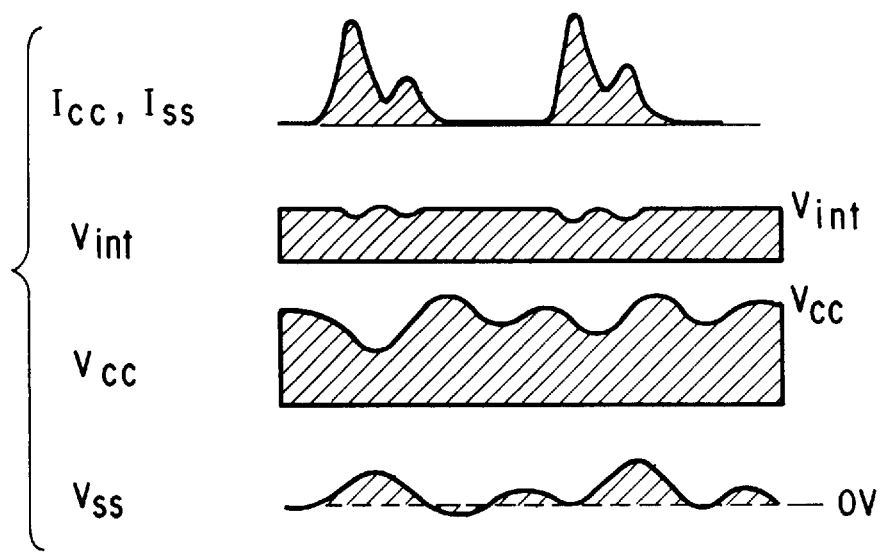
FIG. 2 is an operation waveform diagram of the circuit shown in FIG. 1.
Figure 3:
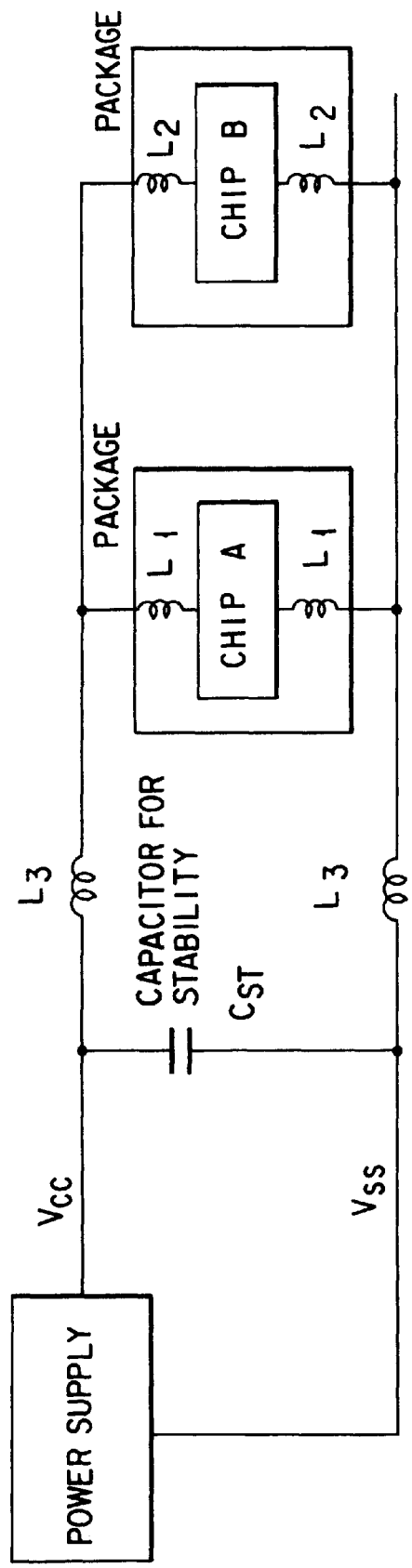
FIG. 3 is an equivalent circuit diagram of a conventional PCB.
Figure 4:
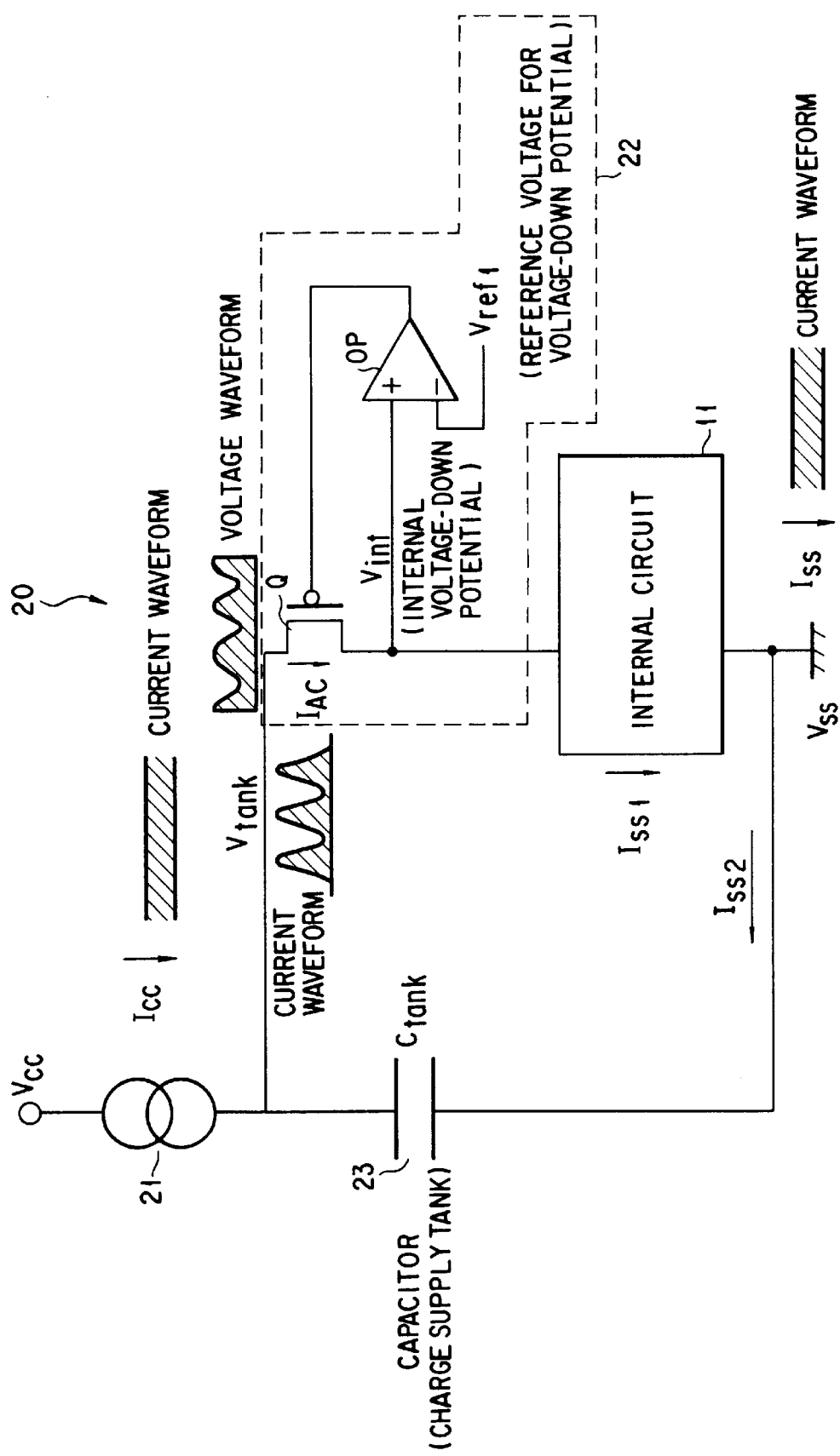
FIG. 4 is a circuit diagram showing a semiconductor device according to a first embodiment of this invention and an operation waveform diagram thereof.
Figure 5:
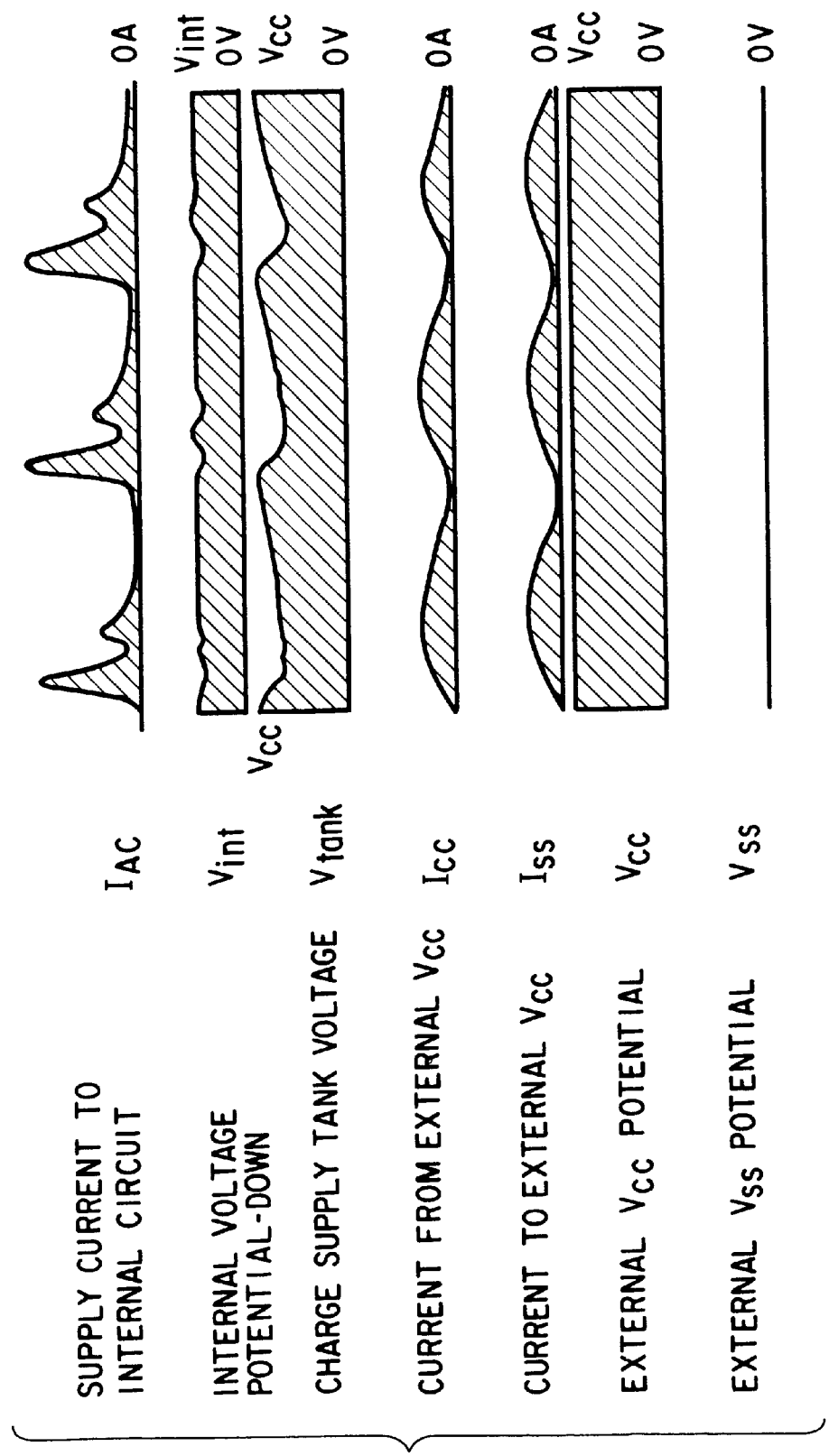
FIG. 5 is an operation waveform diagram of the device shown in FIG. 4.

FIG. 4 is a circuit construction diagram showing a semiconductor device according to a first embodiment of this invention and FIG. 5 is a diagram showing operation waveforms thereof. A voltage-down circuit 20 for generating an internal power supply voltage ($V_{int}$) by lowering the external power supply voltage ($V_{cc}$) in the chip is connected to a chip internal circuit 11. The voltage-down circuit 20 includes a first circuit 21 which is connected at one end to the external power supply, a second circuit 22 connected between the other end of the first circuit 21 and the internal circuit 11, for creating $V_{int}$, and a capacitor C connected to a connection node of the first circuit 21 and the second circuit 22.

The first circuit 21 is a constant current source, and the second circuit 22 is constructed by a transistor Q and an operational amplifier OP like the conventional voltage-down circuit. The capacitor 23 functions as a charge supply tank (capacitor tank) $C_{tank}$, and it is charged by the first circuit 21 when a current flowing into the second circuit 22 is smaller than a preset value, and it supplies a discharging current to the second circuit 22 when the current flowing into the second circuit 22 is larger than the preset value.

In this device, the capacitor tank $C_{tank}$ is provided, and when a current ($I_{ss1}$) is consumed in the internal circuit 11, the current consumption is supplied from the capacitor tank $C_{tank}$ so as to suppress a variation in $V_{int}$ due to the current consumption to minimum. That is, the node of the capacitor tank $C_{tank}$ corresponds to the external power supply $V_{cc}$ of the conventional voltage-down circuit, and ideally, a current $I_{AC}(t)$ which is the same as the internal current $I_{ss1}(t)$ is passed through the transistor Q. In other words, the relation of $I_{AC}(t)=I_{ss1}(t)$ can be automatically attained by controlling Q to make $V_{int}$ constant.

An output of the operational amplifier to which $V_{int}$ and a reference potential $V_{ref1}$ are input is input to the gate of Q. At the time of $V_{int}>V_{ref1}$, Q is turned ON, and at the time of $V_{int} \leq V_{ref1}$, Q is turned OFF so that the internal voltage-down potential $V_{int}$ will automatically tend to be set equal to $V_{ref1}$.

Thus, a variable current flows between the node ($V_{int}$) of $C_{tank}$ and $V_{int}$, and the circuit 21 for passing a constant current $I_{cc}$ is connected between $C_{tank}$ and the external power supply $V_{cc}$ as shown in FIG. 4. A variation rate of $I_{cc}$ with time is smaller than a variation rate of $I_{ss1}$ flowing in the internal circuit 11. With this construction, when $I_{ss1}$ is large, $I_{cc} < I_{ss1}$, when $I_{ss1}$ is small, $I_{cc} > I_{ss1}$, and thus when $I_{ss1}$ is large, charges are supplied from $C_{tank}$, and when $I_{ss1}$ is small, charges are supplied to $C_{tank}$.

As a result, even when the internal circuit 11 is a chip having an extremely large current peak, it can be treated as a chip having smooth currents $I_{cc} < I_{ss}$ as shown in FIG. 5 when viewed from the outside of the chip. The reason why $I_{ss}$ can also be made smooth is that $I_{ss}=I_{ss1}-I_{ss2}$ and charges are charged or discharged on the opposite electrode of $C_{tank}$ to make $I_{ss}$ smooth. If an ideal constant current circuit is inserted as the first circuit 21 between $V_{cc}$ and $V_{tank}$, a current from the outside of the chip can be made theoretically constant, and as a result, fluctuation in the power supply voltage in the PCB can be eliminated. Even if the constant current circuit is not perfect, the smooth currents $I_{cc}$, $I_{ss}$ having peaks smaller than the peak of $I_{AC}$ as shown in FIG. 5 can be easily obtained.

By the smooth (or constant) currents $I_{ss}$, $I_{cc}$, the fluctuation in the power supply voltage due to the IR drop of the resistance component of the power supply can be suppressed to minimum (or to "0") and the influence by the parasitic inductances of inner leads and bonding wires on the PCB can be reduced (or eliminated) because dI/dt can be suppressed (or reduced to "0").

In this embodiment, the fluctuation in the power supply voltage of the PCB can be reduced, the ability of the main power supply can be made small, the capacitance of the stabilizing capacitor on the PCB can be made small, and the influence of noise caused by a variation in the power supply voltage of the chip and exerted on another chip, for example, a chip having no voltage-down circuit can be reduced. Ideally, the noise can be reduced to "0". Of course, the above operation can be realized even when the voltage-down circuit is provided on the $V_{ss}$ side and a raised potential $V_{ssint}$ higher than $V_{ss}$ is set.

The constant current source of the circuit 21 in FIG. 4 can be formed of a simple resistor. Further, the constant current source of the circuit 21 can be omitted although the effected is lowered. Various configurations of the circuit 21 are as follows.

(Embodiment 2)

Figure 6:
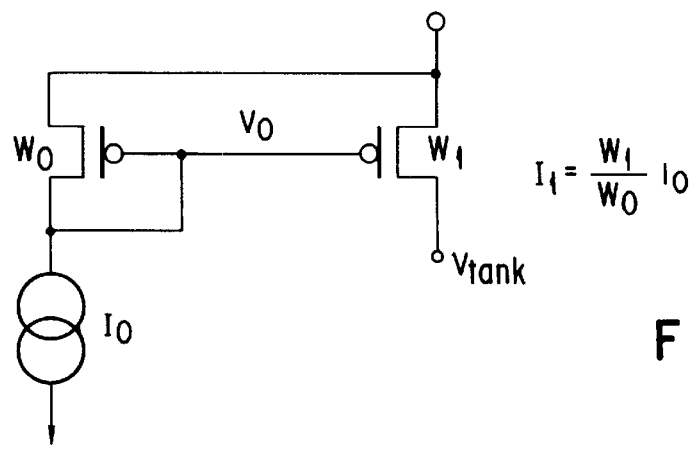
FIG. 6 is a circuit construction diagram showing a constant current circuit portion shown in FIG. 4, for illustrating a second embodiment.

FIG. 6 shows a second embodiment of this invention and shows a constant current source portion of the circuit 21 in FIG. 4. In FIG. 6, first and second transistors respectively having channel widths $W_0$ and $W_1$ ($W_0 < W_1$) are used to pass a small constant current $I_0$ in the first transistor, and a voltage obtained at the operating point in the balanced state is set to $V_0$ and is used as an input to the second transistor with the channel width $W_1$. This configuration is made to suppress the standby current leak, and in this case, $I_{cc}$ in FIG. 4 is given by the following equation.

$$I_{cc} = I_1 = (W_1/W_0) \cdot I_0$$

In this case, if $I_0$ is a constant current although the current value thereof is small, $I_{cc}$ can be made to have a large constant current value. When the capacitor is inserted between $V_{cc}$ and $V_0$, a variation of the current can be reduced even if $V_{cc}$ is varied by Bump etc.

(Embodiment 3)

Figure 7A:
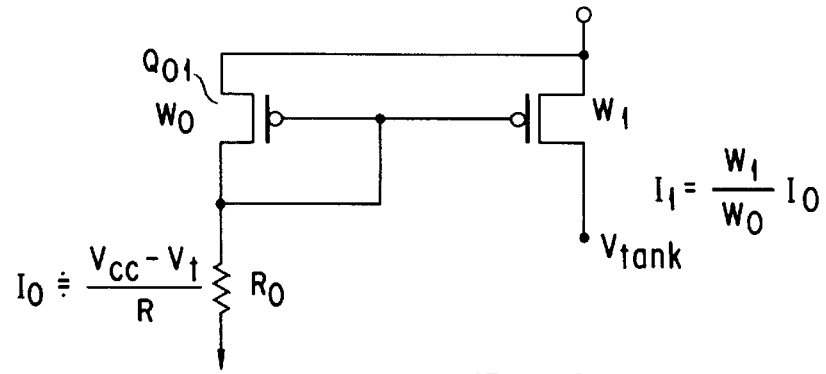
FIGS. 7A to 7C are circuit construction diagrams more specific than that of FIG. 6, for illustrating a third embodiment.
Figure 7B:
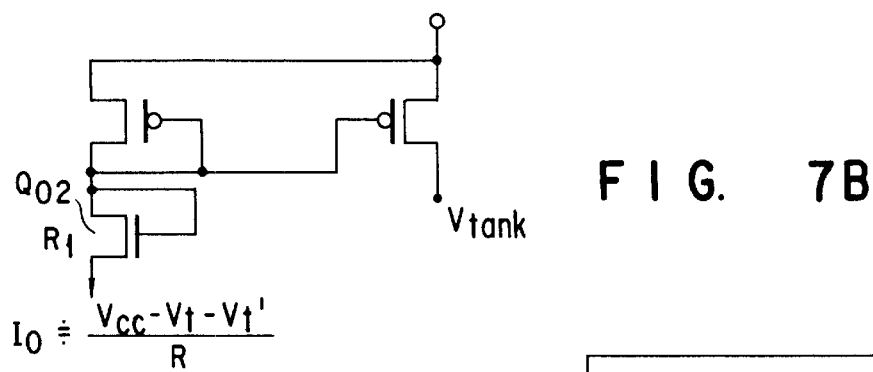
Figure 7C:
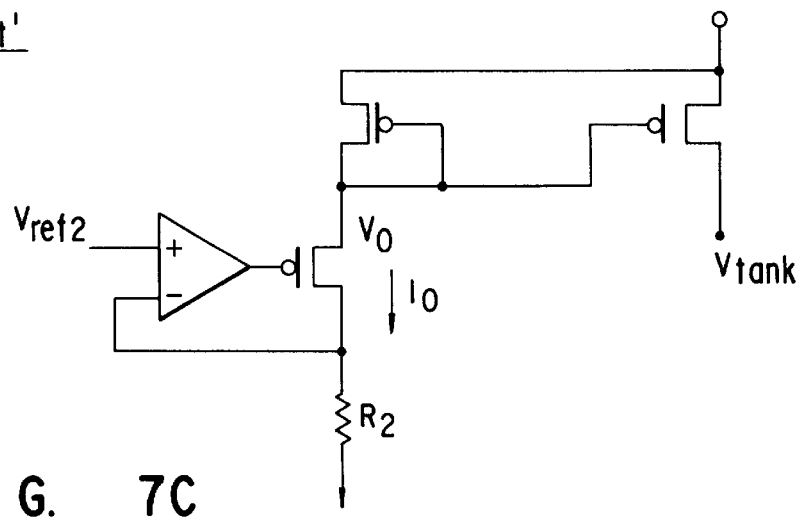

FIGS. 7A to 7C show a third embodiment of this invention and show more concrete examples of the circuit shown in FIG. 6.

In FIG. 7A, a constant current $I_0$ which is approximately equal to $(V_{cc} - V_t)/R$ is generated. $V_t$ indicates a threshold voltage of a transistor $Q_{01}$. Unlike the case of FIG. 7A, in FIG. 7B, a resistor is formed of a transistor $Q_{02}$ as a load transistor. In this case, if the resistance of the load transistor $Q_{02}$ is $R_1$, $I_0$ is given as follows.

$$I_0 = (V_{cc} - V_t - V_t')/R_1$$

where $V_t'$ is a threshold voltage of $Q_{02}$.

FIG. 7C shows a case wherein an operational amplifier is used and $I_0$ is given as follows.

$$I_0 = V_{ref2}/R_2$$

Thus, a more stable constant current can be obtained, and $I_1$ given by the following equation can be derived.

$$I_1 = (V_{ref2}/R_2) \cdot (W_1/W_0) = \text{constant}.$$

(Embodiment 4)

Figure 8A:
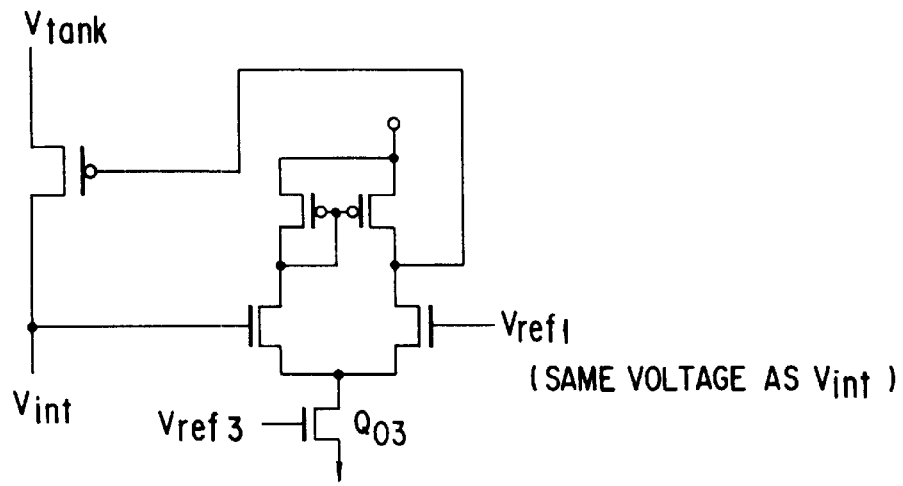
FIGS. 8A and 8B are specific circuit construction diagrams of an operational amplifier shown in FIG. 4, for illustrating a fourth embodiment.
Figure 8B:
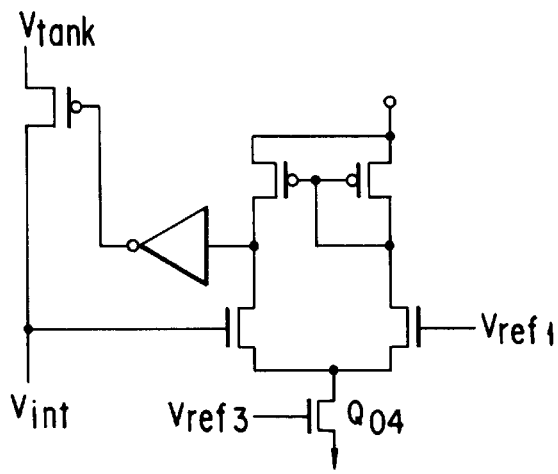

FIGS. 8A and 8B show a fourth embodiment of this invention and more concretely show the operational amplifier section in FIG. 4. In FIGS. 8A and 8B, a current mirror type operational amplifier is shown and currents flowing in transistors $Q_{03}$, $Q_{04}$ are controlled by the potential $V_{ref3}$ so as to be made constant. Further, in the circuit of FIG. 8B, a buffer is connected to the output of the operational amplifier.

(Embodiment 5)

Figure 9:
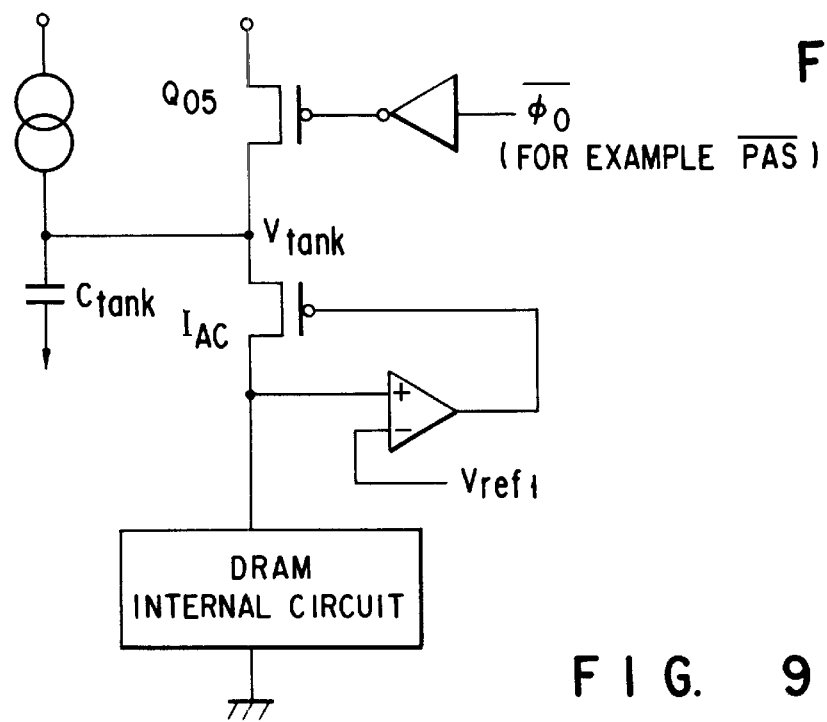
FIG. 9 is a circuit construction diagram showing a fifth embodiment.

FIG. 9 shows a fifth embodiment of this invention.

$I_{cc}$ in FIG. 4 is ideally a constant current, but since the potential $V_{tank}$ varies, it is difficult to make $I_{cc}$ completely constant. When a large current flows in the internal circuit ($I_{ss1}$ is large), the potential difference between $V_{cc}$ and $V_{tank}$ becomes larger and $I_{cc}$ tends to be made large. In this respect, for example, a case of FIG. 10 in which currents flowing in the active state and standby state are previously known as in a DRAM is considered. For example, the peak (A) occurs when a word line is selected to fetch a row address, the peak (B) occurs at the time of charging/discharging of the bit line, the peak (C) occurs at the output time of $D_{out}$, and no peak occurs at the other time.

Figure 10:
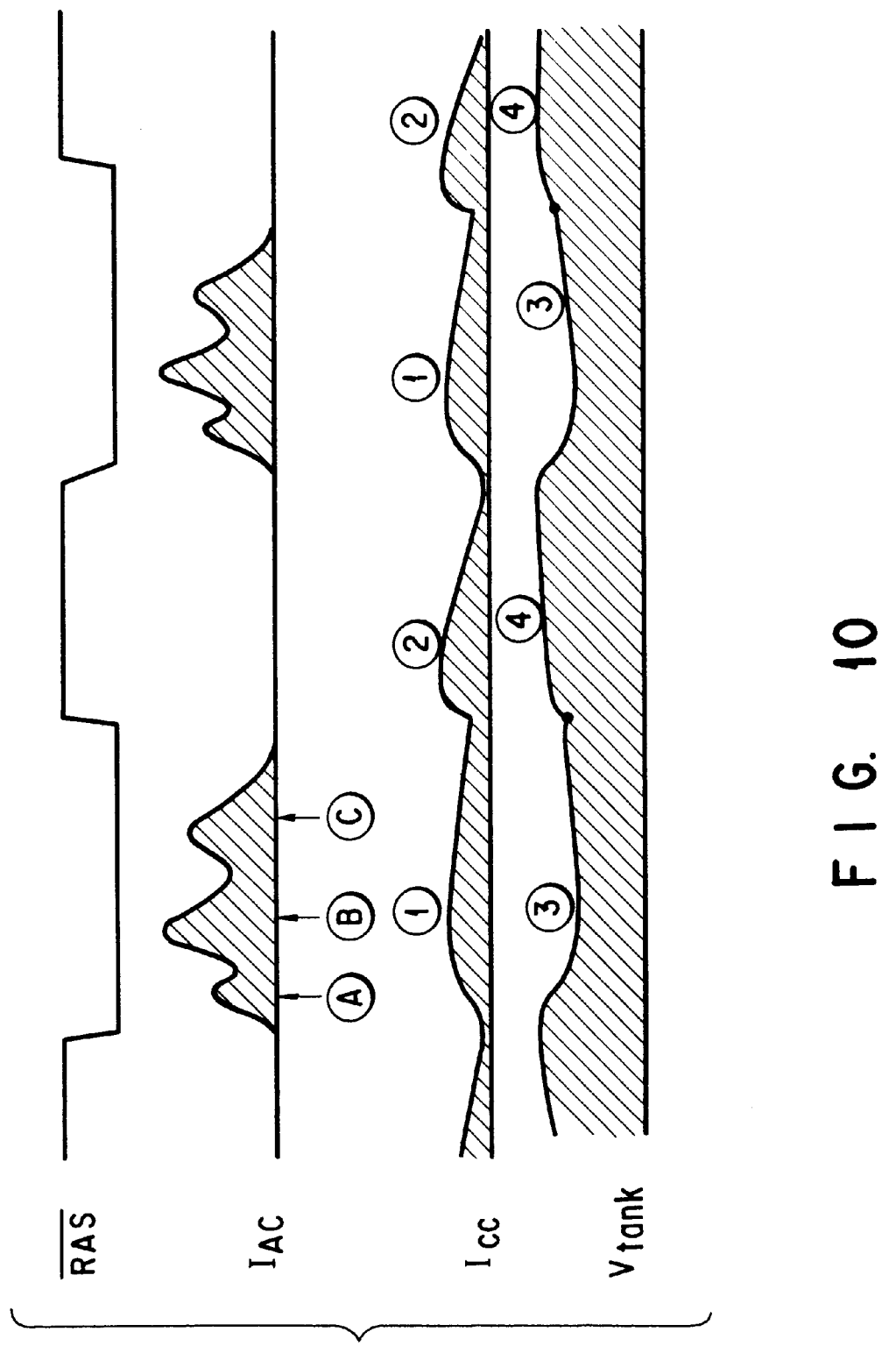
FIG. 10 is an operation waveform diagram of the device shown in FIG. 9.

At the peaks (A) to (C), the potential of $V_{tank}$ is lowered and then the potential of $V_{tank}$ is gradually raised by $I_{cc}$, but when the standby mode is set, for example, the potential of $V_{tank}$ is raised and set closer to $V_{cc}$ so as to reduce the value of $I_{cc}$. When the operation can be thus estimated, for example, a transistor $Q_{05}$ is used and is turned ON in the standby mode as shown in FIG. 10. Then, the current value of $I_{cc}$ becomes /RAS="High" and is prevented from being lowered in an "ON" state, which essentially becomes smaller value. $I_{cc}$ becomes closer to a constant current on a macroscale basis. That is, $V_{tank}$ will not be recharged to $V_{cc}$ in the DRAM cycle if the current ① is not made large in a case wherein $Q_{05}$ is not used.

If the operation current is thus previously known, it is possible to insert the switch between $V_{tank}$ and $V_{cc}$.

(Embodiment 6)

Figures 11, 13:
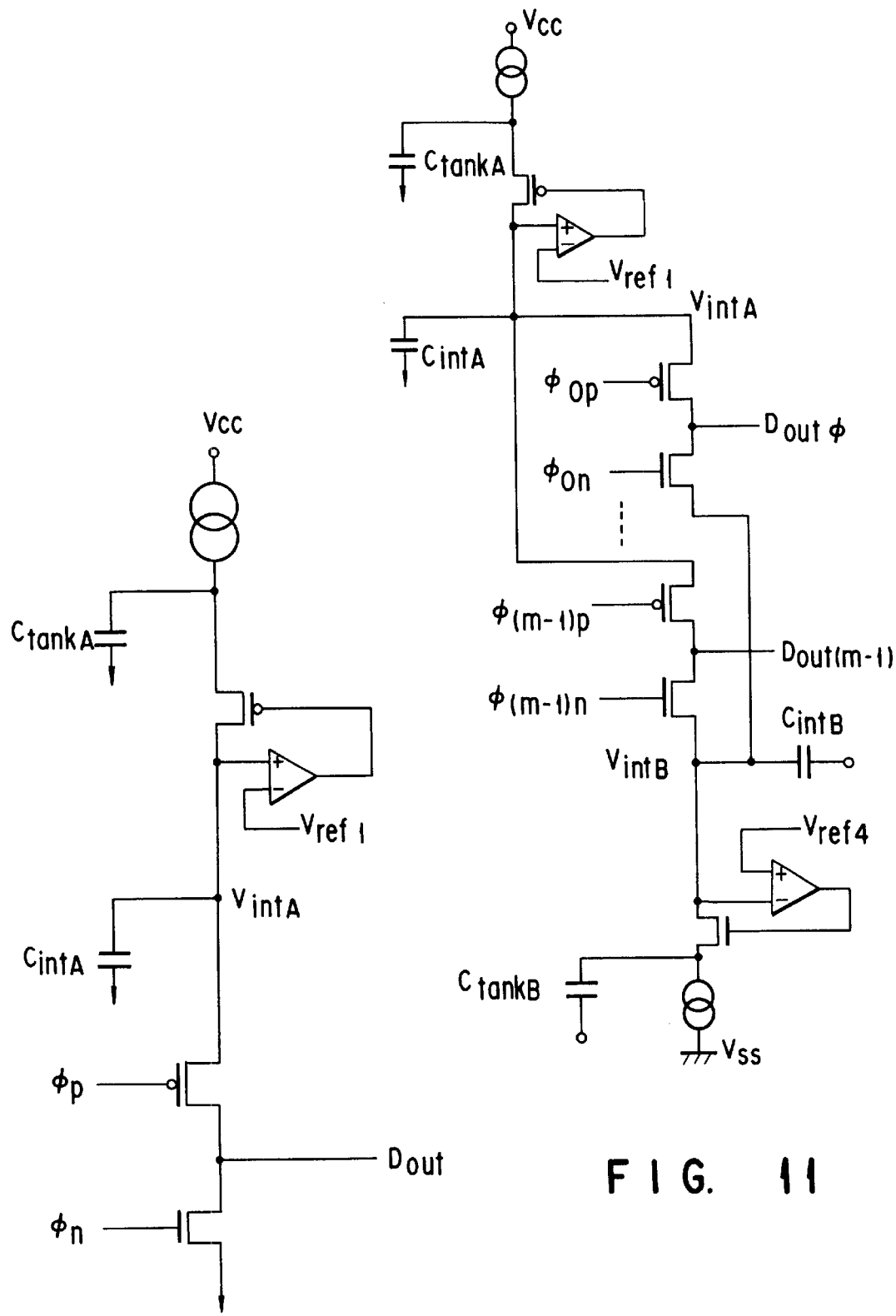
FIG. 11 is a circuit construction diagram showing a sixth embodiment.
FIG. 13 is a circuit construction diagram showing a seventh embodiment.

FIG. 11 is a circuit construction diagram showing a sixth embodiment of this invention and FIG. 12 is an operation waveform diagram thereof.

In this example, an internal voltage $V_{intA}$ obtained by lowering $V_{cc}$ and an internal voltage $V_{intB}$ obtained by raising $V_{ss}$ are generated and the internal circuit is operated on a voltage between $V_{intA}$ and $V_{intB}$. A circuit for generating $V_{intB}$ is substantially a voltage-down circuit, but it is a type of booster circuit for generating a potential obtained by raising $V_{ss}$ when viewing it from the $V_{ss}$ side.

In a case where the $D_{out}$ number becomes ×32, ×64, ×128 as in a DRAM, CPU, DSP or the like and the peak current of the output buffer and the power supply noise become extremely large, the voltage-down circuit of this invention is added on the $V_{cc}$ side and $V_{ss}$ side to reduce the output amplitude of $D_{out}$ and reduce the average current. Further, the power supply noise of the output buffer is reduced by setting $I_{cc}$, $I_{ss}$ to constant currents.

Thus, in the multi-bit output buffer or multi-bit bus in the chip, the power supply noise can be suppressed by applying this invention. In FIG. 11, an example of m $D_{out}$ buffers of $D_{out(0)}$ to $D_{out(m-1)}$ is shown.

The amplitude is reduced from a value ($V_{cc} - V_{ss}$) by using two tanks $C_{tankA}$ and $C_{tankB}$. The tanks $C_{tankA}$ and $C_{tankB}$ can be commonly used in another internal circuit of the chip or can be independently used as in this case. Further, instead of using the voltage-down circuits for both of the $V_{cc}$ and $V_{ss}$ sides, the voltage-down circuit may be used for one of the $V_{cc}$ and $V_{ss}$ sides.

(Embodiment 7)

Further, it is possible to use a voltage-down circuit for each output terminal ($D_{out}$) or for every preset number of output terminals. FIG. 13 shows a seventh embodiment of this invention showing a case wherein a voltage-down circuit is used only for the $V_{cc}$ side. In this example, the internal voltage-down potential is set to $V_{intA}$. The operation waveform thereof is shown in FIG. 14. The output amplitude is set between $V_{ss}$ and $V_{intA}$.

Recently, various types of interfaces for reducing the output amplitude of a chip are proposed instead of the conventional CMOS, TTL interfaces. For example, Terminated low voltage TTL (T-LVTTL), Gunning Terminated Logic (GTL), Center Tap terminated (CTT), RAMBUS interface, Series Terminated Stub Bus (ST-Bus) and the like are provided and a combination of the voltage-down circuit and the output circuit of this invention can be used in the above interfaces.

Figure 15:
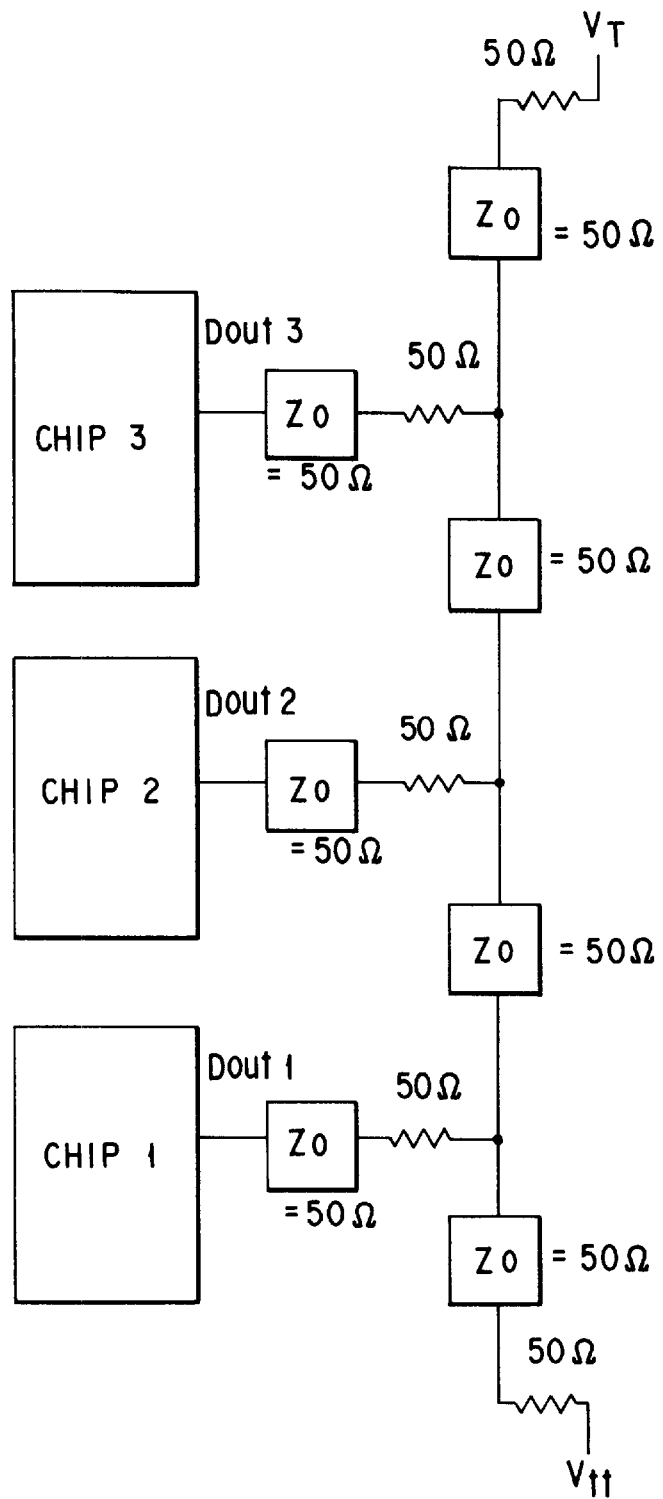
FIG. 15 is a circuit construction diagram showing an example of ST-Bus in the seventh embodiment.

FIG. 15 shows an example of ST-Bus. Outputs of several chips are connected to one bus, and both of the termination ends of transmission lines with characteristic impedance $Z_0$ (=50Ω) are coupled to the terminal voltages $V_T$ and $V_{tt}$ via the terminal resistors of 50Ω. One bus has branches at plural portions and the branches are respectively connected to the outputs of the chips via resistors of 50Ω and $Z_0$.

FIG. 16A shows the operation waveform of an example in which ST-bus is connected to the circuit of FIG. 13, and FIG. 16B shows the operation waveform of an example in which ST-bus is connected to the circuit of FIG. 11.

It is only required in ST-Bus that the output potential is set in a range of $V_{tt}±0.4$ V where $V_{tt}=0.45V_{cc}$, that is, the output potential is set in a range of 3.3 V×0.45±0.4 V=1 V to 1.9 V when $V_{cc}=3.3$ V, and therefore, when the voltage-down circuit is used only for $V_{cc}$ shown in FIG. 16A, it is only required for $V_{intA}$ to be set equal to or higher than 1.9 V. When the internal power supply $V_{intB}$ is also provided on the $V_{ss}$ side as shown in FIG. 16B, it is only required for $V_{intB}$ to be set equal to or lower than 1 V. In either case, since a potential difference of approximately 1 V occurs between the power supply potential and the internal potential, the effect of this invention can be fully attained.

Since the output potential is determined by the resistance ratio of the 50Ω terminal resistance shown in FIG. 15 to the resistance of the output driver transistor, the amplitude of the potential varies between $V_{intA}$ and $V_{ss}$ in the case of FIG. 16A and between $V_{intA}$ and $V_{intB}$ in the case of FIG. 16B. Therefore, if the potential of $V_{intA}$ is set higher than 1.9 V and the potential of $V_{intB}$ is set lower than 1 V, the size of the driver transistor can be reduced (the resistance thereof can be increased).

(Embodiment 8)

As described above, according to this invention, since the fluctuation in the power supply voltage due to bonding wires, inner leads of the package or on the PCB can be reduced or suppressed to "0" (that is, dI/dt=0), occurrence of further fluctuation in the power supply voltage by the influence of parasitic inductance in this portion can be suppressed. Further, the influence by inductances of wirings in the chip occurs although it is relatively small in comparison with the influence by the parasitic inductances of bonding wires, inner leads of the package or on the PCB. The influence becomes larger as the chip size increases.

Figure 17:
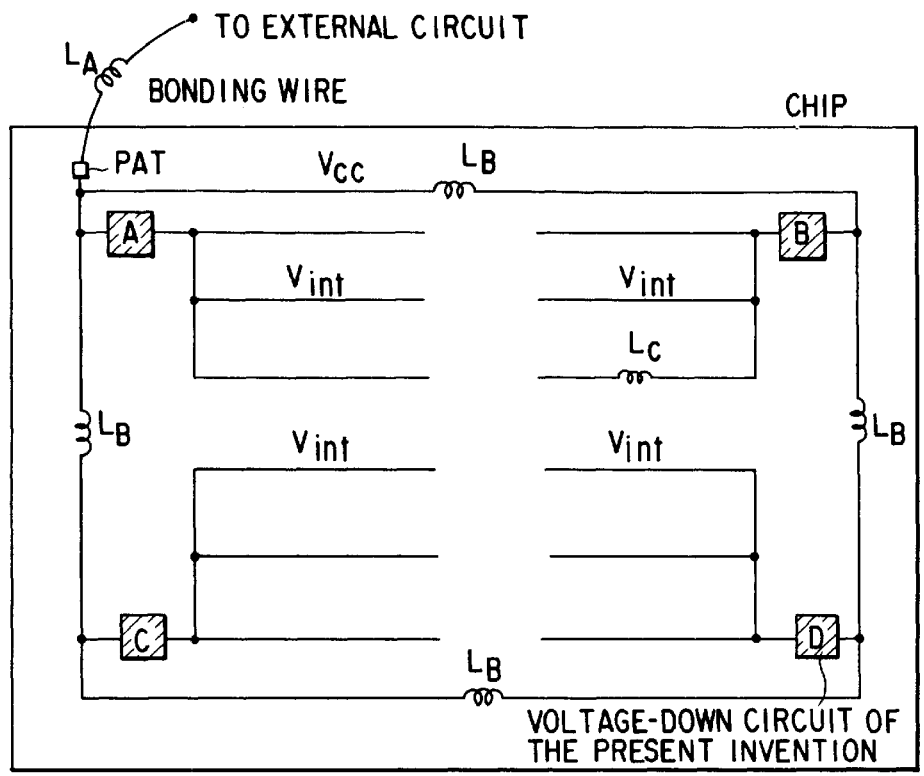
FIG. 17 is a circuit construction diagram showing an eighth embodiment.

An embodiment for suppressing the influence by the inductance is shown in FIG. 17. As shown in FIG. 17, a power supply line is connected to extend from the bonding wire to a pad portion. The power supply $V_{cc}$ is disposed in the chip. Voltage-down circuits which are the same as that shown in FIG. 4 are disposed in various portions (A, B, C, D in FIG. 17) of the chip with $V_{cc}$ used as the power supply voltage, and internal power supply voltages $V_{int}$ are derived from the respective circuits and supplied to corresponding portions.

In this embodiment, the influence by parasitic inductances $L_A$, $L_B$ shown in FIG. 17 can be reduced (or suppressed to "0") since the fluctuation in the power supply voltage can be suppressed in the system ranging from the outside of the chip to the respective voltage-down circuits (A, B, C, D). That is, the influence by $L_B$ due to extension of the long power supply line in the chip can be reduced (or suppressed to "0").

A variation in the power supply voltage occurs for the internal power supply potential $V_{int}$ within a range of the voltage-down circuits (A, B, C, D) and the fluctuation in the power supply voltage by the inductance in this portion occurs, but as shown in this embodiment, since the $V_{int}$ power supply line is dispersedly disposed on the chip and the length of one wiring is small and the inductance thereof is small, the influence thereof can be reduced. Further, if the voltage-down circuits are more dispersedly disposed and the length of the $V_{int}$ power supply line is reduced, the influence by the inductance can be suppressed to substantially "0". When a plurality of power supply voltages $V_{cc}$ are supplied to the chip, a plurality of voltage-down circuits may be dispersedly disposed for the respective $V_{cc}$.

(Embodiment 9)

Figure 18:
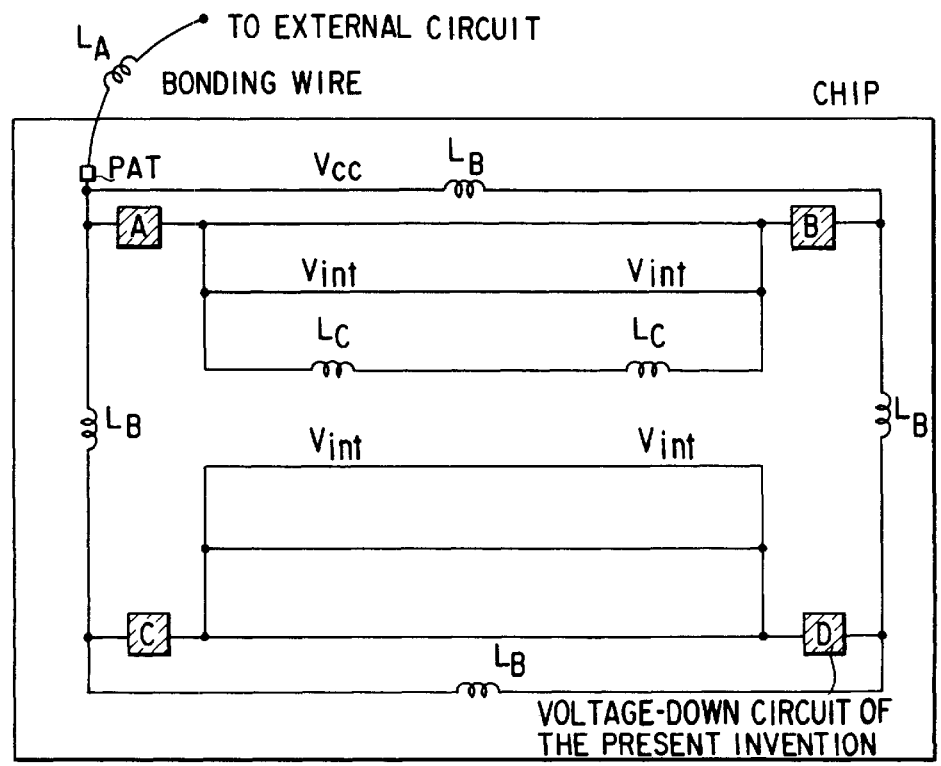
FIG. 18 is a circuit construction diagram showing a ninth embodiment.

FIG. 18 shows a ninth embodiment of this invention. This embodiment is different from the embodiment of FIG. 17 in that the outputs $V_{int}$ of different voltage-down circuits (A, B and C, D) are connected to each other. Since each voltage-down circuit independently generates the internal voltage-down potential $V_{int}$, there occurs little possibility that a current flows only in one direction from the voltage-down circuit (A) side to the voltage-down circuit (B) side, for example, and as a result, dI/dt in $V_{int}$ does not increase. Therefore, the influence by the parasitic inductance LC does not become 2LC and becomes only an LC component as in the case of FIG. 17. Thus, as shown in FIG. 18, if only the circuit of this invention is dispersedly disposed, the influence by the parasitic inductance in the chip can be reduced without dispersedly disposing the wiring of $V_{int}$.

Figure 19:
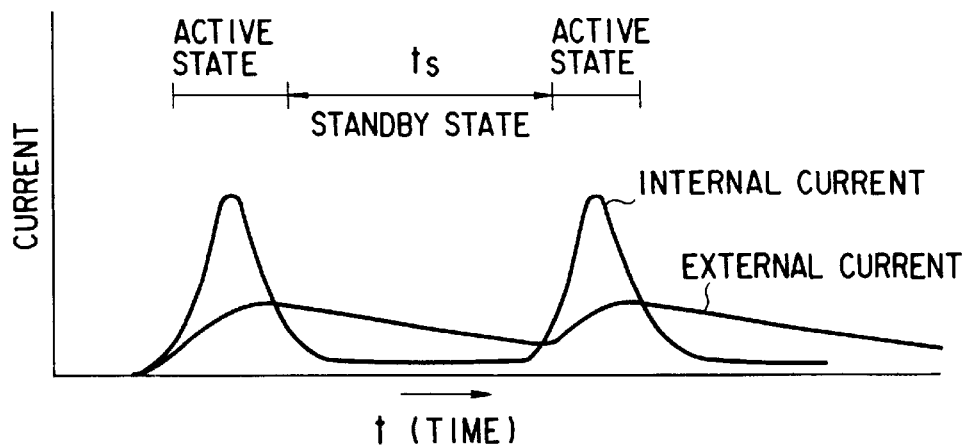
FIG. 19 is a diagram showing the current waveform in a case wherein a device of this invention is applied to a memory as an internal circuit.

The waveform obtained when the device according to the first to ninth embodiments is applied as an internal circuit to a memory such as a DRAM, SRAM or flash memory is shown in FIG. 19.

As shown in FIG. 19, in the memory, a large current rapidly flows in the active state and little current flows in the standby state. The memory has a feature that the standby time is longer than the active time. By this feature, according to this invention, since a current flows from the tank capacitor to the memory in the active state and the tank capacitor is charged in the standby state, the noise can be reduced to about $t_A/(t_A+t_S)$, if the active time is set to $t_A$ and the standby time is set to $t_S$. Therefore, when this invention is applied to a memory, the noise reduction effect can be attained.

Figure 20:
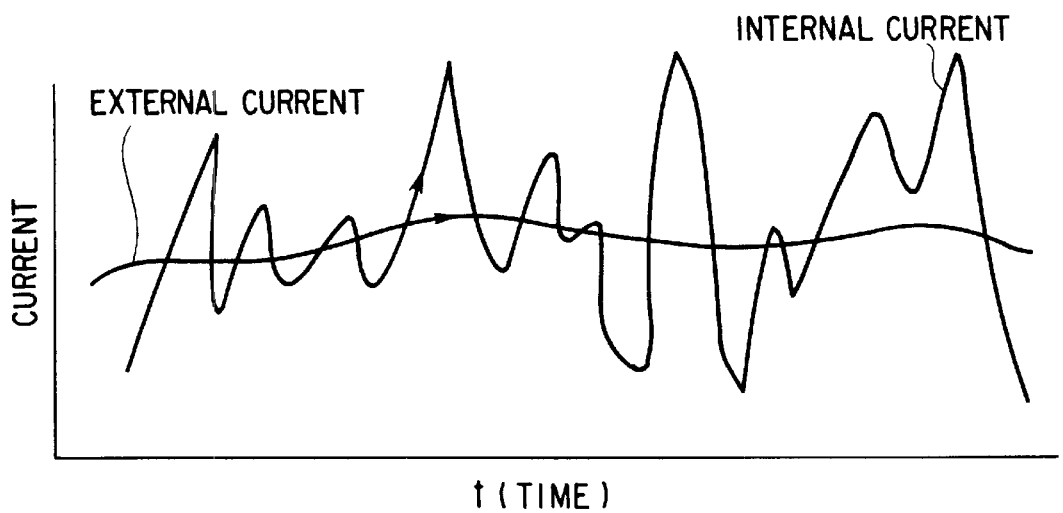
FIG. 20 is a diagram showing the current waveform in a case wherein a device of this invention is applied as an internal circuit to a circuit exhibiting a current waveform having irregular peaks.

Next, in an LSI such as an MPU, logic circuit, ASIC, controller LSI which exhibits a current waveform having violent and irregular peaks as shown in FIG. 20, since the peak current is smoothed by the reason described before according to this invention, the noise can be reduced.

This invention is not limited to the above embodiments and can be variously modified without departing from the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a voltage-down circuit for generating an internal power supply voltage in a chip; and
   a chip internal circuit applied with the internal power supply voltage obtained in said voltage-down circuit,
   wherein said voltage-down circuit includes a first circuit, which is a constant current source, connected at one end to an external power supply, a second circuit connected between another end of said first circuit and said internal circuit for generating the internal power supply voltage, a capacitor connected to a connection node of said first circuit and said second circuit and to a ground node of said chip internal circuit, and a switching transistor connected between said external power supply and the connection node of said first circuit and second circuit.

2. A semiconductor device according to claim 1, wherein said first circuit is a circuit for supplying a current in which a maximum current is smaller than a maximum current of a current flowing in said internal circuit, and said capacitor is charged by said first circuit when a current flowing in said second circuit is smaller than a preset value and supplies a discharge current to said second circuit when the current flowing in said second circuit is larger than the preset value, and said switching transistor is turned on during a standby cycle.

3. A semiconductor device according to claim 1, wherein said second circuit is a circuit for supplying a further current which is substantially the same as the current flowing in said internal circuit according to the current flowing in said internal circuit.

4. A semiconductor device according to claim 1, wherein said second circuit is a circuit for detecting the internal power supply voltage and supplying a further current to keep the internal power supply voltage constant.

5. A semiconductor device according to claim 4, wherein said second circuit includes a transistor having a drain connected to the other end of said first circuit and a source connected to said internal circuit, and an operational amplifier supplied with a source potential of said transistor and a reference potential for voltage-down potential as inverted inputs and supplying an output to the gate of said transistor.

6. A semiconductor device according to claim 4, wherein said second circuit includes a transistor having a drain connected to the other end of said first circuit and a source connected to said internal circuit, and an operational amplifier supplied with a source potential of said transistor and a reference potential for booster potential as inverted inputs and supplying an output to the gate of said transistor.

7. A semiconductor device according to claim 1, wherein said second circuit includes a transistor having a drain connected to the other end of said first circuit and a source connected to said internal circuit, and an operational amplifier supplied with a source potential of said transistor and a reference potential for voltage-down potential as inverted inputs and supplying an output to the gate of said transistor.

8. A semiconductor device comprising:
   a booster circuit for generating an internal power supply voltage; and
   a chip internal circuit applied with the internal power supply voltage obtained in said booster circuit,
   wherein said booster circuit includes a first circuit, which is a constant current source, connected at one end to an external ground terminal and a second circuit connected between another end of said first circuit and said internal circuit, a capacitor connected to a connection node of said first circuit and said second circuit and to a power supply node of said chip internal circuit, and a switching transistor connected between said external ground terminal and the connection node of said first circuit and second circuit.

9. A semiconductor device according to claim 8, wherein said first circuit is a circuit for supplying a current in which a maximum current is smaller than a maximum current of a current flowing in said internal circuit, said capacitor is charged by said first circuit when a current flowing in said second circuit is smaller than a preset value and supplies a discharge current to said second circuit when the current flowing said second circuit is larger than the preset value, and said switching transistor is turned on during a standby cycle.

10. A semiconductor device according to claim 9, wherein said first circuit includes a transistor, in which a source is connected to an external ground terminal and a drain is connected to the connection node of said second circuit, operated in the saturated region.

11. A semiconductor device according to claim 8, wherein said second circuit is a circuit for supplying a further current which is substantially the same as the current flowing in said internal circuit according to the current flowing in said internal circuit.

12. A semiconductor device according to claim 8, wherein said second circuit is a circuit for detecting the internal power supply voltage and supplying a further current to keep the internal power supply voltage constant.

13. A semiconductor device according to claim 12, wherein said second circuit includes a transistor having a drain connected to the other end of said first circuit and a source connected to said internal circuit, and an operational amplifier supplied with a source potential of said transistor and a reference potential for voltage-down potential as inverted inputs and supplying an output to the gate of said transistor.

14. A semiconductor device according to claim 12, wherein said second circuit includes a transistor having a drain connected to the other end of said first circuit and a source connected to said internal circuit, and an operational amplifier supplied with a source potential of said transistor and a reference potential for booster potential as inverted inputs and supplying an output to the gate of said transistor.

15. A semiconductor device according to claim 8, wherein said second circuit includes a transistor having a drain connected to the other end of said first circuit and a source connected to said internal circuit, and an operational amplifier supplied with a source potential of said transistor and a reference potential for booster potential as inverted inputs and supplying an output to the gate of said transistor.

16. A semiconductor device according to claim 8, wherein said booster circuit has a plurality of booster circuits formed in the same chip.

17. A semiconductor device comprising;
   a voltage-down circuit for generating a first internal power supply voltage ($V_{int1}$) obtained by lowering an external power supply voltage ($V_{cc}$) in a chip;
   a booster circuit for generating a second internal power supply voltage ($V_{int2}$) obtained by raising an external ground voltage ($V_{ss}$) in a chip; and
   a chip internal circuit applied with the internal power supply voltage ($V_{int1}$, $V_{int2}$) obtained in said voltage-down circuit and said booster circuit,
   wherein said voltage-down circuit includes a first circuit connected at one end to an external power supply and a second circuit connected between the other end of said first circuit and said internal circuit for generating the first internal power supply voltage ($V_{int1}$), and a first capacitor connected to a first connection node of said first circuit and said second circuit, wherein said booster circuit includes a third circuit connected at one end to an external ground terminal and a fourth circuit connected between the other end of said third circuit and said internal circuit for generating the internal power supply voltage ($V_{int2}$), and another node of said first capacitor is connected to a second connection node of said third circuit and said fourth circuit, and wherein said first circuit is a circuit for supplying a first current in which a maximum current is smaller than a maximum current of a current flowing in said internal circuit, and said third circuit is a circuit for supplying a second current in which a maximum circuit thereof is smaller than the maximum current of the current flowing in said internal circuit.

18. A semiconductor device according to claim 17, wherein each of said first and third circuits is a circuit for supplying a constant current.

19. A semiconductor device according to claim 17, wherein said second circuit is a circuit for supplying a first further current which is substantially the same as the current flowing in said internal circuit according to the current flowing in said internal circuit, and said fourth circuit is a circuit for supplying a second further current which is substantially the same as the current flowing in said internal circuit according to the current flowing in said internal circuit.

20. A semiconductor device according to claim 17, wherein said second circuit is a circuit for detecting the internal power supply voltage and supplying a current to keep the internal power supply voltage constant, and said fourth circuit is a circuit for detecting the internal power supply voltage and supplying a current to keep the internal power supply voltage constant.

21. A semiconductor device according to claim 20, wherein said second circuit includes a transistor having a drain connected to the other end of said first circuit and a source connected to said internal circuit, and an operational amplifier supplied with the source potential of said transistor and a reference potential for voltage-down potential as inverted inputs and supplying an output to the gate of said transistor, and said fourth circuit includes a transistor having a drain connected to the other end of said third circuit and a source connected to said internal circuit, and an operational amplifier supplied with the source potential of said transistor and a reference potential for booster potential as inverted inputs and supplying an output to the gate of said transistor.

22. A semiconductor device according to claim 17, wherein said second circuit includes a transistor having a drain connected to the other end of said first circuit and a source connected to said internal circuit, and an operational amplifier supplied with the source potential of said transistor and a reference potential for voltage-down potential as inverted inputs and supplying an output to the gate of said transistor, and said fourth circuit includes a transistor having a drain connected to the other end of said third circuit and a source connected to said internal circuit, and an operational amplifier supplied with the source potential of said transistor and a reference potential for booster potential as inverted inputs and supplying an output to the gate of said transistor.

23. A semiconductor device according to claim 17, wherein said voltage-down circuit and said booster circuit have a plurality of voltage-down circuits and a plurality of booster circuits formed in the same chip.

24. A semiconductor device according to claim 17, wherein said first circuit includes a first transistor, in which a source is connected to an external power supply line and a drain is connected to said first connection node, said third circuit includes a second transistor, in which a source is connected to an external ground terminal and a drain is connected to said second connection node, and said first and second transistors are operated in the saturated region.

25. A semiconductor device comprising:

a voltage-down circuit for generating an internal power supply voltage obtained by lowering an external power supply voltage in a chip; and a chip internal circuit applied with the internal power supply voltage obtained in said voltage-down circuit, wherein said voltage-down circuit includes a first circuit connected at one end to an external power supply and a second circuit connected between the other end of said first circuit and said internal circuit for generating the internal power supply voltage, and a capacitor connected to a connection node of said first circuit and said second circuit and to a ground node of said chip internal circuit, wherein said capacitor is charged by said first circuit when a first current flowing in said second circuit is smaller than a preset value and supplies a discharge current to said second circuit when the first current flowing in said second circuit is larger than the preset value, and wherein said first circuit is a circuit for supplying a second current with a first variation rate with time which is smaller than a second variation rate of a third current flowing in said internal circuit with time.

26. A semiconductor device comprising:

a booster circuit for generating an internal power supply voltage; and a chip internal circuit applied with the internal power supply voltage obtained in said booster circuit, wherein said booster circuit includes a first circuit, which is a constant current source, connected at one end to an external ground terminal and a second circuit connected between the other end of said first circuit and said internal circuit for generating the internal power supply voltage, and a capacitor connected to a connection node of said first circuit and said second circuit and to a power supply node of said chip internal circuit, wherein said capacitor is charged by said first circuit when a first current flowing in said second circuit is smaller than a preset value and supplies a discharge current to said second circuit when the first current flowing in said second circuit is larger than the preset value, and wherein said first circuit is a circuit for supplying a second current with a first variation rate with time which is smaller than a second variation rate of a third current of flowing in said internal circuit with time.

27. A semiconductor device comprising:

a voltage-down circuit for generating a first internal power supply voltage ($V_{int1}$) obtained by lowering an external power supply voltage ($V_{cc}$) in a chip;

a booster circuit for generating a second internal power supply voltage ($V_{int2}$) obtained by raising an external ground voltage ($V_{ss}$) in a chip; and a chip internal circuit applied with the internal power supply voltages ($V_{int1}$, $V_{int2}$) obtained in said voltage-down circuit and said booster circuit, wherein said voltage-down circuit includes a first circuit connected at one end to an external power supply and a second circuit connected between the other end of said first circuit and said internal circuit for generating the first internal power supply voltage ($V_{int1}$), and a first capacitor connected to a first connection node of said first circuit and said second circuit, wherein said booster circuit includes a third circuit connected at one end to an external ground terminal and a fourth circuit connected between the other end of said third circuit and said internal circuit for generating the internal power supply voltage ($V_{int2}$), and another node of said first capacitor is connected to a second connection node of said third circuit and said fourth circuit, and wherein said first circuit is a circuit for supplying a first current with a first variation rate with time which is smaller than the second variation rate of the second current flowing in said internal circuit with time, and said third circuit is a circuit for supplying a third current with a third variation rate with time which is smaller than the second variation rate of the second current flowing in said internal circuit with time.

28. A semiconductor device comprising:

a constant current source, which has a first end connected to a first power supply and which supplies a predetermined current;

a circuit connected between a second end of said constant current source and a second power supply and whose consumption current is varied between a greater value and a lesser value than the predetermined current; and a capacitor connected between said second end of said constant current source and said second power supply, and which is charged when the consumption current of said circuit is less than the predetermined current, and which is discharged when the consumption current of said circuit is greater than the predetermined current.

29. The semiconductor device according to claim 28, wherein said circuit comprises:

an internal circuit; and a voltage conversion circuit connected to said internal circuit and which supplies a voltage difference which is different from a voltage difference between said first power supply and said second power supply to said internal circuit.

30. An implementation substrate comprising:

a substrate;

first and second power supply wirings formed on said substrate;

a first semiconductor chip formed on said substrate and which is connected between said first power supply wirings and said second power supply wirings; and a second semiconductor chip formed on said substrate and which is connected between said first power supply wirings and said second power supply wirings, wherein at least one of said first and second semiconductor chip comprises:

a constant current source, which has a first end connected to said first power supply wiring and which supplies a predetermined current;

a circuit which is connected between a second end of said constant current source and said second power supply wiring and whose consumption current is varied between a greater value and a lesser value than the predetermined current; and a capacitor connected between said second end of said constant current source and said second power supply wiring, and which is charged when the consumption current of said circuit is less than the predetermined current, and which is discharged when the consumption current of said circuit is greater than the predetermined current.

* * * * *